United States Patent [19]

Hawkins et al.

[11] Patent Number: 5,708,264
[45] Date of Patent: Jan. 13, 1998

[54] PLANAR COLOR FILTER ARRAY FOR CCDS FROM DYED AND MORDANT LAYERS

[75] Inventors: Gilbert Allan Hawkins, Mendon; David Lawrence Losee, Fairport; Robert Leroy Nielsen, Pittsford; Michael John Hanrahan, Hilton, all of N.Y.

[73] Assignee: Eastman Kodak Company, Rochester, N.Y.

[21] Appl. No.: 554,884

[22] Filed: Nov. 7, 1995

[51] Int. Cl.$^6$ ............................................. G01J 3/51
[52] U.S. Cl. ........................ 250/226; 250/208.1; 257/294
[58] Field of Search ................................. 257/294, 222, 257/432; 250/226, 208.1

[56] References Cited

U.S. PATENT DOCUMENTS

| | | | |
|---|---|---|---|
| 4,081,277 | 3/1978 | Brault et al. | 96/38 |
| 4,204,866 | 5/1980 | Horak et al. | 430/306 |
| 4,247,799 | 1/1981 | Drexhage | 313/367 |
| 4,307,165 | 12/1981 | Blazey et al. | 430/8 |
| 4,315,978 | 2/1982 | Hartman | 430/4 |
| 4,387,146 | 6/1983 | Whitmore | 430/7 |
| 4,395,629 | 7/1983 | Sasano et al. | 250/226 |
| 4,553,153 | 11/1985 | McColgin et al. | 357/30 |
| 4,764,670 | 8/1988 | Pace et al. | 250/226 |
| 4,876,167 | 10/1989 | Snow et al. | 430/7 |
| 5,132,251 | 7/1992 | Kim et al. | 437/225 |
| 5,321,249 | 6/1994 | Nomura | 250/208 |
| 5,404,005 | 4/1995 | Shimomura et al. | 250/208.1 |
| 5,479,049 | 12/1995 | Aoki et al. | 257/642 |

*Primary Examiner*—Edward P. Westin
*Assistant Examiner*—Alan L. Giles
*Attorney, Agent, or Firm*—Raymond L. Owens

[57] ABSTRACT

An image sensor which includes an integral color filter array and a method of making such sensor is disclosed. The sensor includes a semiconductor substrate having an overlying support layer with an optically planar surface, a plurality of spaced image pixels formed in the substrate; and an array of contiguous color filter elements overlying the planar surface whose top surfaces are coplanar and which have no overlap of color filter material between adjacent color filter elements.

7 Claims, 17 Drawing Sheets

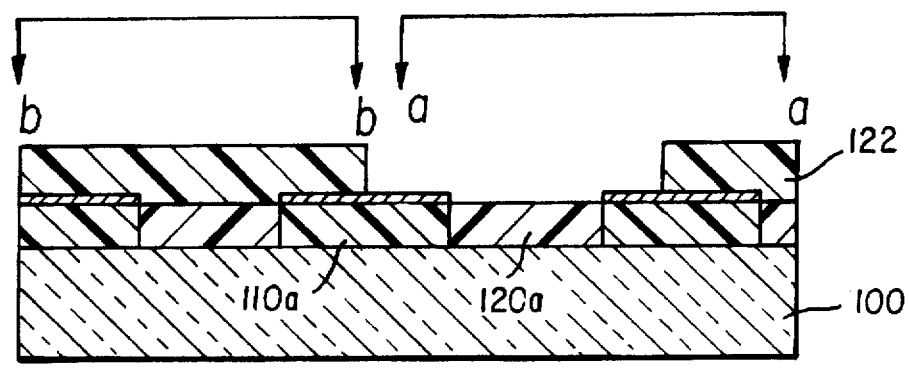
FIG. 3G1
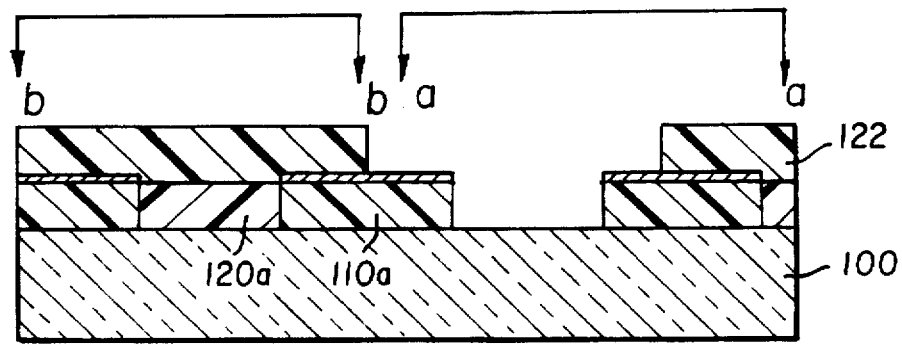
FIG. 3H1

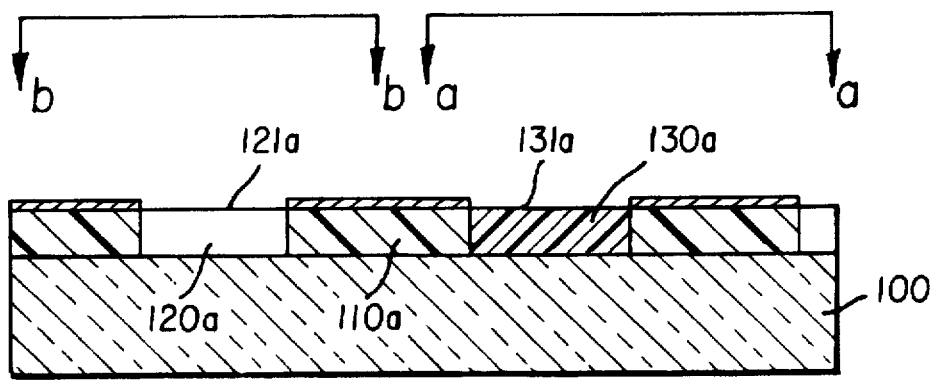
FIG. 3I1
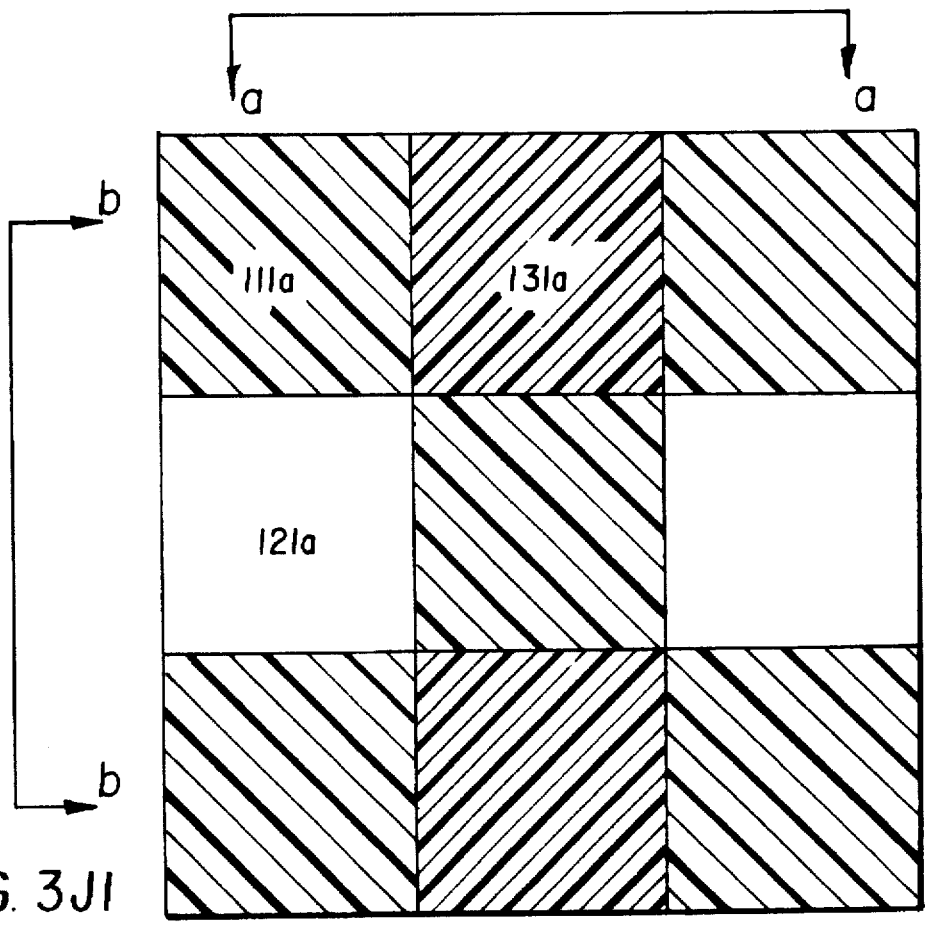
FIG. 3J1

PLANAR COLOR FILTER ARRAY FOR CCDS FROM DYED AND MORDANT LAYERS

CROSS REFERENCE TO RELATED APPLICATION

Reference is made to commonly assigned U.S. Ser. No. 08/553,123, filed concurrently herewith, now abandoned, entitled "Planar Color Filter Array for CCDs With Embedded Color Filter Elements" by Hawkins et at, the teachings of which are incorporated herein by reference.

FIELD OF THE INVENTION

This invention relates to a solid state color image sensor which include a plurality of color filter elements.

BACKGROUND OF THE INVENTION

A solid state imager can be viewed as including a number of laterally offset pixels containing photosensitive regions. Arrays of color filter elements transmitting selected portions of the visible spectrum and placed in registration with the pixels of a solid state imager are well known to the art and can take a variety of forms. Each color filter element transmits a portion of the color spectrum of incident light into the associated pixel of the imager in order to provide the imager with means of color sensitization. All visible image sensors, including linear sensors, can utilize color filters whether or not the photosensitive region occupies the entire pixel area.. Typically, the color filter elements are transmissive of a set of primary colors such as red, green and blue or of complementary colors such as cyan, yellow, and magenta and or white. Lens arrays integral to the image sensor, commonly made by thermal deformation of photolithographically defined polymers, are often employed over color filter arrays to direct light rays through color filter elements to the photosensitive regions.

FIG. 1 shows a single pixel 10 of a typical interline image sensor in registration with color filter elements 24a and 24b partially including a color filter array, lens 22, photodiode 14 formed in semiconductor substrate 12, gate electrode 16, and light shield 18. The gate electrode and light shield are typically isolated electrically from one another and from the substrate by isolation oxides not shown. A color filter array includes a plurality of color filter elements 24a, 24b, and 24c, typically provided in a pattern of three or more elements each transmitting a different spectral region. Photodiode 14, semiconductor substrate 12, gate electrode 16, and light shield 18 form semiconductor portion 40 of the imager.

The prior art image sensor with a pixel shown in FIG. 1 has a partially planarizing layer 20a for offsetting the color filter element 24a from photodiodes 14. Conventionally, the partially planarizing layer includes an organic spacer layer spin coated to achieve some degree of planarization in order to provide simpler processing conditions for deposition of the color filter array, such as the color filter arrays described in Nomura, U.S. Pat. No. 5,321,249, typically coated from organic materials. Partially planarizing layer 20a enables better process control of the thickness of the color filter elements, essential in controlling the spectral transmission characteristics. The use and limitations of such planarizing layers in optically active solid state image sensors is taught by McColgin, U.S. Pat. No. 4,553,153 for a polymerizable monomer. Upper planarizing layer 20b in FIG. 1 is typically used to space lens 22 away from photodiode 14 and partially compensates for irregular topography of conventional color filter elements.

As shown in FIG. 1, prior art color filter arrays suffer to some degree from lack of planarity, due to both lack of planarity of the substrate on which they are formed (region 60 of FIG. 1 and of FIGS. 2A and 2B) and lack of planarity of the color filter elements relative to one another (region 62 of FIG. 1 and of FIGS. 2A and 2B). Lack of planarity of the substrate produces variations in the thickness of the color filter element materials coated on the substrates, which in turn causes local differences in the optical transmission characteristics within each element. Lack of planarity between color filter elements (region 62 of FIG. 1 and of FIGS. 2A and 2B) also results in inter-pixel nonuniformities and in addition causes unwanted light piping and color mixing in regions where a subsequently defined color filter element overlaps a previously defined color filter element. Hartman, U.S. Pat. No. 4,315,978, teaches a method of making color filter arrays in which color filter elements are formed by creating dyeable islands separated by dye impermeable polymers. Neighboring color filter elements, however, overlap to some degree, altering spectral transmission characteristics of color filter elements, and the process typically on mask to mask alignment accuracy, thereby reducing process latitude. Spectral characteristics are similarly difficult to control, particularly if the pixel size is small, because the area of misalignment must be reduced with pixel size to maintain adequate color resolution. In addition, the overlapping regions make subsequent coatings difficult to coat smoothly.

Various approaches have been undertaken to improve the planarity of the color filter arrays and the substrates on which they are formed, but none has been fully satisfactory. Nomura, U.S. Pat. No. 5,321,249, relies on spin-on color filter materials which and to some extent self-planarizing. When the materials for the second or the third color filter elements are coated, this technique greatly reduces the thickness of the spun-on material left over the previously deposited color filter elements (region 62 of FIG. 2B) because the previously deposited elements are topographically high, as is well known in the art of spin-on planarization. However, not all the material is removed. Horak, U.S. Pat. No. 4,204,866, teaches a method of making color filter elements in which a single mordant layer is dyed through openings in the photoresist, the process being repeated using dyes of different colors to provide side-by-side color filter elements. However, the color filter elements are not self aligned, so that the process is sensitive to mask to mask misalignment tolerances. Also, the mordant swells when dyed. As is well known in the art, so that the surface of the single mordant layer becomes non-planar; and the lateral diffusion of the dyes is too large for very small pixels, being at least the thickness of the mordant layer, typically several microns.

Brault, U.S. Pat. No. 4,081,277 teaches repeated thermal dye transfer into a receiving layer using a photoresist mask, but this method also suffers from poor lateral definition of the dye and has not found use in small pixels. Drexhage, U.S. Pat. No. 4,247,799, discloses a single dyed polymer layer that is photobleachable, so that in principal regions of different colors can be formed by optical exposure at different wavelengths, but the edges of the color filter elements are not abruptly defined by this process due to light scatter and beam focus at the scale of a few tenths of a micron. This method has not found acceptance due to the need for special exposure equipment and to the difficulty of finding dyes which are both photobleachable and whose spectral properties are optimal for imagers. Pace and Blood, U.S. Pat. No. 4,764,670, discuss a two layer subtractive color system which provides precise control of density and hue and reduce the number of colors needed in each layer. Although their schematic illustrations indicate perfect registration of the color filter elements, no method is provided for achieving perfect registration, there being still a need for photolithographic alignment to define the lateral extent of the first and the second dyed layer and their overlap, nor is mordant swelling prevented. While this technique is advantageous for large pixel sizes, lack of planarity is disadvantageous for small image sensors, for example for pixels less than 10 microns in size. Snow et al, U.S. Pat. No. 4,876,167, describes a variety of photo-crosslinkable mordants to enable deposition of dyes in specific regions of a mordant which have been exposed optically, but these materials also suffer from lack of adequate spatial resolution, residual dye instability, and from swelling of the mordant. Blazey, U.S. Pat. No. 4,307,165, and Whitmore, U.S. Pat. No. 4,387,146 disclose the confinement of dyes in cells, but the means of fabrication using organic cell structures with thick cell walls formed photolithographically or by embossing has not proven advantageous for small pixel imagers due to the gap between dyed regions, and to the fact that thin walls are prone to distortion when they are not supported by material between them, as is the case for the cells described U.S. Pat. No. 4,387,146 and U.S. Pat. No. 4,307,165. This is particularly true for semiconductor process environments due to the use of fluid baths whose surface tension can distort unsupported thin walls, as is well known in the art.

SUMMARY OF THE INVENTION

It is an object of this invention to provide a color filter array for a solid state imager which reduces or eliminates the problems cited above by permitting all color filter elements of the array to have entirely coplanar top and bottom surfaces having no overlap and having minimal gaps or no gaps between adjacent elements.

It is another object of this invention to provide a method of making such an array on an arbitrary, planar surface.

These objects are achieved in an image sensor which includes an integral color filter array, comprising:
(a) a semiconductor substrate having an overlying support layer with an optically planar surface;
(b) a plurality of spaced image pixels formed in the substrate; and
(c) an array of contiguous color filter elements overlying the planar surface whose top surfaces are coplanar and which have no overlap of color filter material between adjacent color filter elements.

These objects are also achieved in an image sensor which includes an integral color filter array, comprising:
(a) a semiconductor substrate having an overlying support layer with an optically planar surface;
(b) a plurality of spaced image pixels formed in the substrate; and
(c) an array of contiguous color filter elements overlying the planar surface whose top surfaces are coplanar and which have no overlap of color filter material between adjacent color filter elements and whose adjacent color filter elements are separated by an inorganic protective film which is a dye diffusion barrier.

These objects are achieved in a method of making a solid state image sensor having a color filter array with non-overlapping, coplanar color filter elements, the method comprising:
(a) providing a semiconductor substrate having spaced image pixels;
(b) depositing at least one transparent support layer over the pixels and making the support layer optically planar by chemical mechanical polishing;
(c) providing a first color filter layer on the planar surface of the support layer;
(d) uniformly depositing a first protective film;
(e) patterning the protective film and the first color filter layer to provide first color filter elements contiguous with the first color filter elements;
(f) uniformly providing a second color filter layer; and
(g) planarizing the second color filter layer to the extent that it is entirely removed over the first color filter elements to provide second color filter elements.

ADVANTAGES

An advantage of image sensors made in accordance with this invention is that the gap between color filter elements is minimal or vanishes entirely. It is also advantageous that there can be no overlap between color filter elements.

Another advantage is that the color filter elements may be self aligned to one another so that mask to mask misalignments do not degrade performance or yield.

An advantage of this invention is that the surface upon which the color filter array is disposed is rendered optically planar so that light rays are refracted only as expected from an ideal dielectric interface.

A further advantage is that substantially identical processes may be used to make arrays from a variety of materials.

A feature of image sensors made in accordance with this invention is that the top surface of the color filter array is entirely planar.

DETAILED DESCRIPTION OF THE PREFERRED EMBODIMENTS

Figure 1:
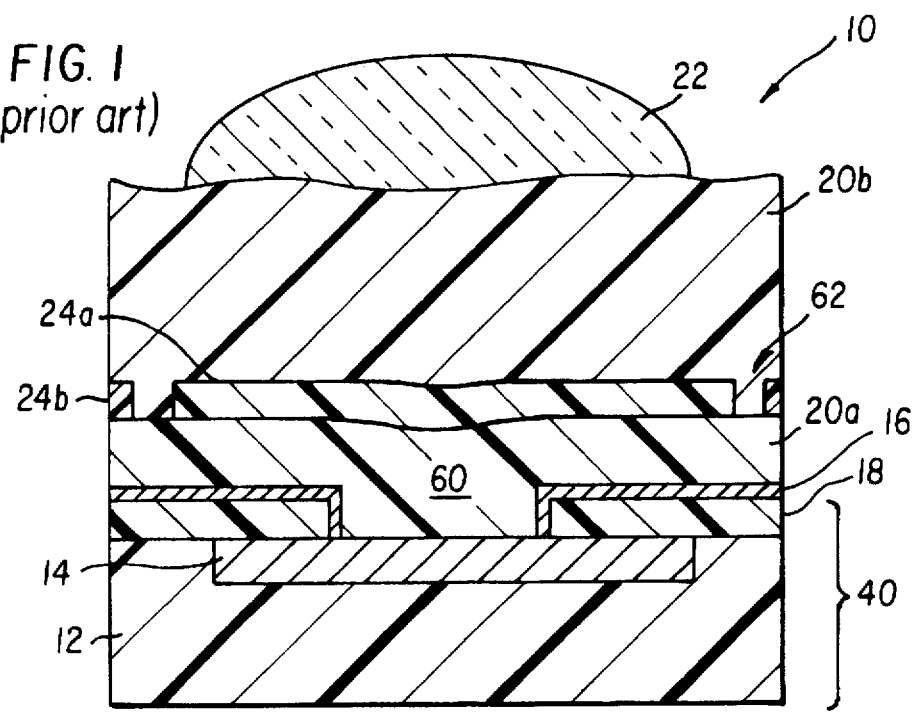
FIG. 1 shows a partial schematic cross-sectional view of prior art image sensor.
Figure 3A:
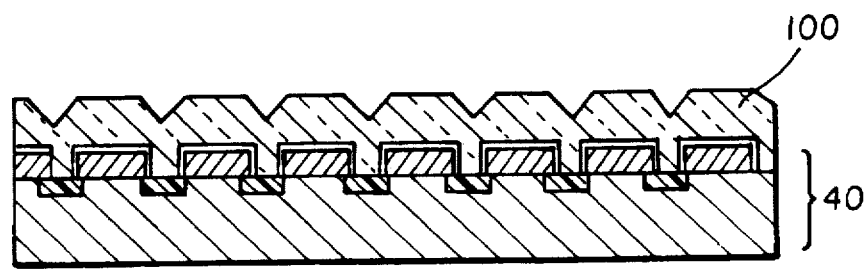
FIGS. 3A-3J show cross-sectional views of different stages of an imager pixel made in accordance with this invention.
Figure 3B:
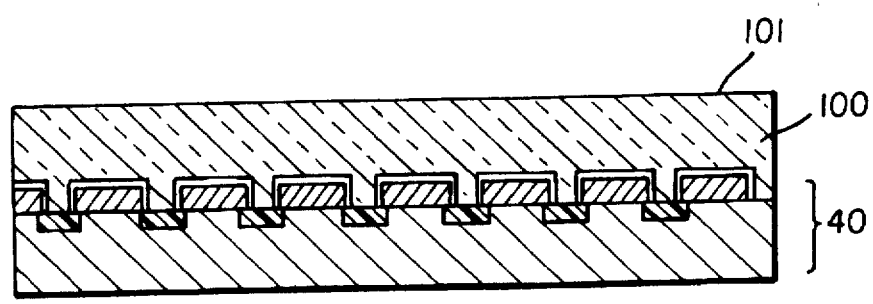
Figure 3C:
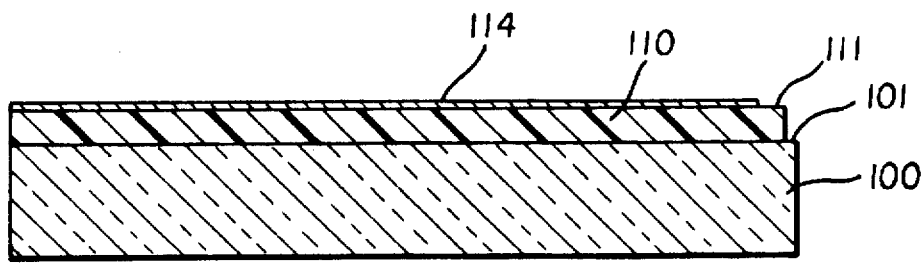
Figure 3D:
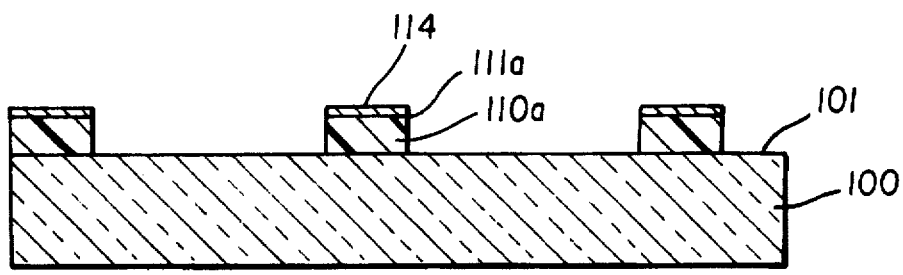
Figure 3E:
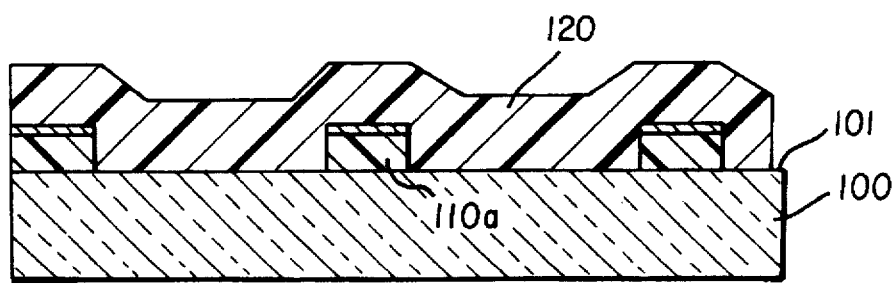
Figure 3F:
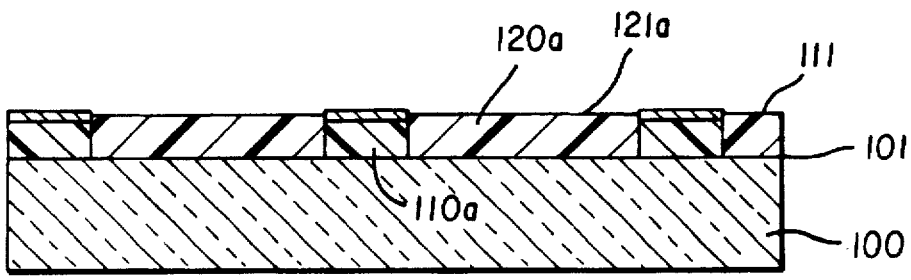

Referring to FIG. 3A, support layer 100, preferably a spin on glass, is provided over semiconductor portion 40 of an imager, the imager being depicted in FIG. 1. Where like parts correspond, the same numbers are used in these and the remaining figures. The thickness of support layer 100 is preferably greater than the height of the topography of semiconductor portion 40, typically between 0.5 and 1.0 micron. As shown in FIG. 3B, support layer 100 is rendered optically planar by chemical mechanical polishing, such that incident light rays on surface 101 of support layer 100 are refracted only as expected at an ideal planar dielectric interface. In FIG. 3C, a first color filter layer 110 with planar surface 111, preferably a dyed polyimide or a pigment or a pigment mixture, is provided uniformly on planar surface 101 of support layer 100. First color filter layer 110 may be spin coated, in the preferred case that it is a dyed polyimide, or may be deposited by other means, such as evaporation, in the case that the it is an evaporable pigment. Also in FIG. 3C, first protective fill 114, preferably an etch stop to chemical mechanical polishing such as a nitride fill of thickness from 100 A to 1000 A, is deposited uniformly on planar surface 101. Then, conventional photoresist patterning followed by two sequential steps of reactive ion etching (the first etching first protective layer 114 and the second etching first color filter layer 110) is used to define first color filter elements 110a with planar surfaces 111a, as shown in FIG. 3D. Next, a second color filter layer 120, preferably also a dyed polyimide transmitting a different portion of the visible spectrum from that of first color filter layer 110, is shown deposited with a thickness exceeding that of first color filter layer 110, as depicted in FIG. 3E. As in the case of first color filter layer 110, second color filter layer 120 may be spin coated in the preferred case that it is a dyed polyimide, or it may be deposited by other means, such as evaporation, in the case that the color filter layer is an evaporable pigment. This layer is then removed, preferably by chemical mechanical polishing, using a slurry of aluminum oxide entirely from, over the first color filter elements 110a, thereby forming adjacent second color filter elements 120a (FIG. 3F).

The planar surfaces 121a of second color filter elements 120a are shown substantially coplanar with the surfaces 111a of the first color filter elements 110a. This may be accomplished by extending the time of chemical mechanical polishing slightly beyond that required for the removal of the second color filter layer from over the first color filter elements, while still remaining a planar surface 121a, as is well known in the art of chemical mechanical polishing.

Figure 3G:
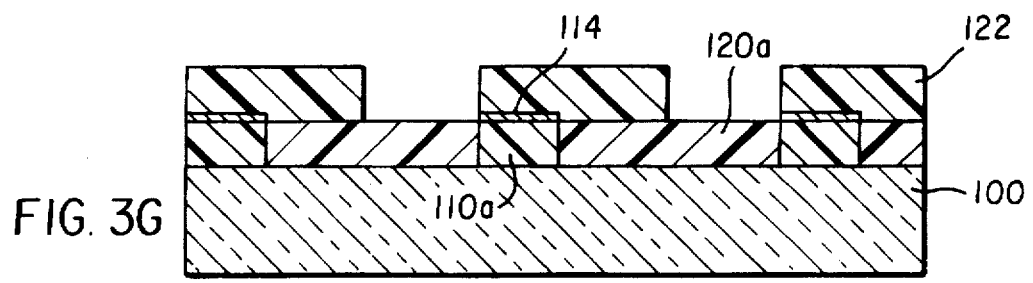

In FIG. 3G, photoresist 122 is coated and patterned so that the photoresist openings in the photoresist extend from near the middle of second color filter element 120a to just over fast color filter element 110a. Then, by using an etch which is selective to first protective layer 114 and to support layer 100, preferably an oxygen containing reactive ion etch, openings 128 (FIG. 3H) in the second color filter elements are provided with their edges self-aligned to first color filter elements 110a by means of protective layer 114. Second color filter elements 120a are thereby shortened to become modified second color filter elements 120b (FIG. 3H) with planar surfaces 121b.

It is next desired to repeat the process described above to establish a third color filter element contiguous to and coplanar with the first and the modified second color filter elements 110a and 120b. This is accomplished in FIGS. 3I and 3J by depositing a third color filter layer 130, also preferably a dyed polyimide transmitting a different portion of the visible spectrum from that of the first or second color filter elements 110a and 120b, with a thickness exceeding that of the coplanar first and second color filter elements.

Figure 3H:
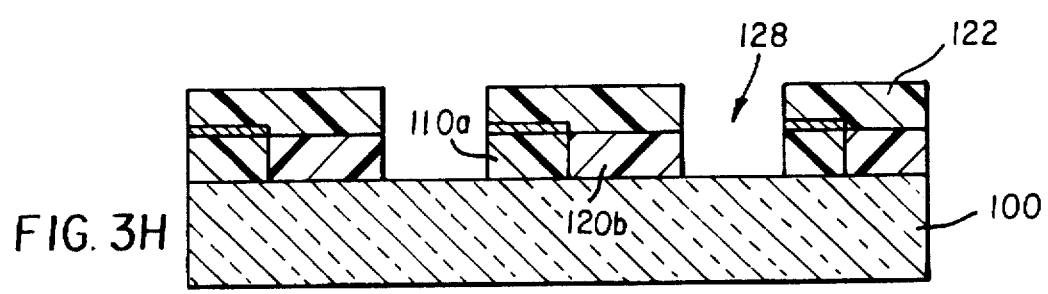
Figure 3I:
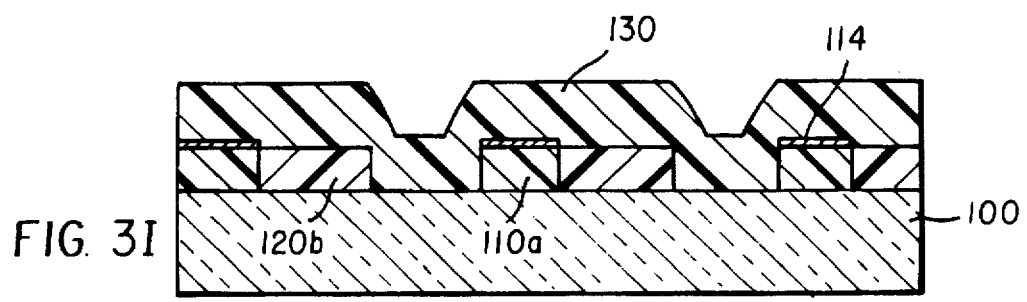
Figure 3J:
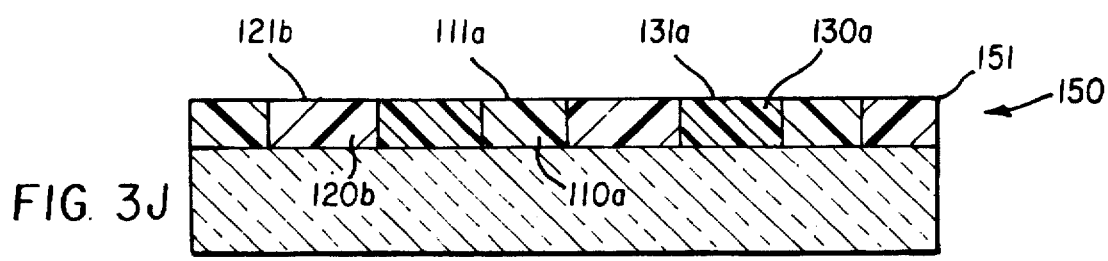

Third color filter layer 130 may be spin coated in the preferred case that it is a dyed polyimide, or it may be deposited by other means, such as evaporation, in the case that the color filter layer is an evaporable pigment. Color filter layer 130 is then removed, preferably by chemical mechanical polishing, using a slurry of aluminum oxide, entirely from over the first and modified second color filter elements 110a and 120b, thereby forming adjacent third color filter elements 130a with planar surfaces 131a (FIG. 3J). Also shown in FIG. 3J, the remaining portions of first protective layer 114 have been removed, by either dry etching in a fluorine containing atmosphere for the preferred case in which the first protective layer is nitride, or by further use of chemical mechanical polishing, thereby providing planar surfaces 111a, 121a, and 131a of contiguous color filter elements 110a, 120b, and 130a, all having sharply defined lateral boundaries without any regions of vertical overlap.

FIGS. 3G1–3J1 depict a related embodiment of the present invention which may be used to make three element color filter arrays in which two of the three colors do not share adjacent edges, as for the color filter pattern shown in plan view in FIG. 3J1. As is well known in the art, the green color filter element would be the typical choice for the color filter element 110a with planar surface 111a (FIG. 3J) comprising the largest portion of the array surface. FIG. 3G1 depicts the structure made in accordance with the previous embodiment (FIGS. 3F and 3G) having two color filter elements 110a and 120a. In FIG. 3G1, an entire color filter element 120a is exposed by patterned photoresist 122 and removed by etching, preferably anisotropic reactive ion etching (FIG. 3H1). Then, using the method discussed in the previous embodiment, a third color filter element 130a is formed in the region from which the entire color filter element 120a was removed. In this manner, the color filter array shown in plan view in FIG. 3J1 is constructed in a minimal number of fabrication steps. It is advantageous in this application that the position of all color filter elements is determined solely by the edge locations of the first color filter element and not by subsequent mask to mask alignments.

Figure 4A:
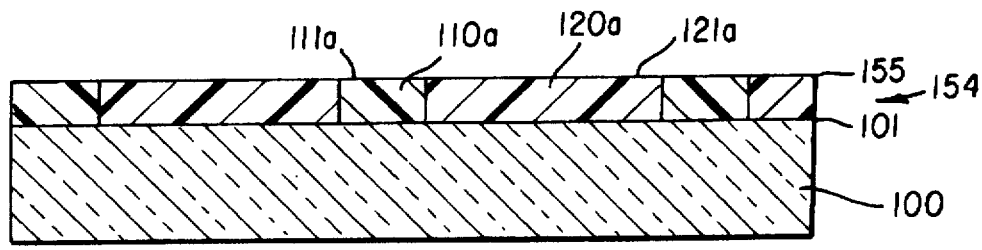
FIGS. 4A-4E show cross-sectional and top views of an imager pixel made in accordance with this invention.
Figure 4B:
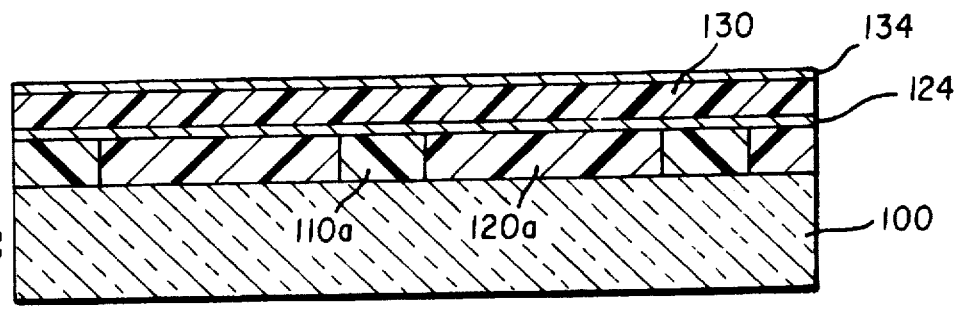
Figure 4C:
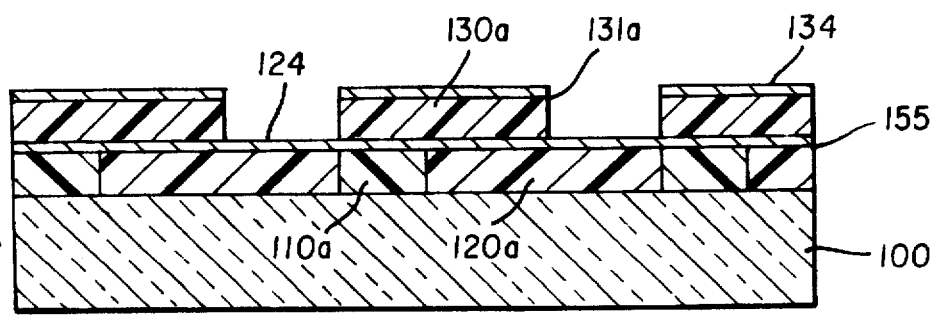
Figure 4D:
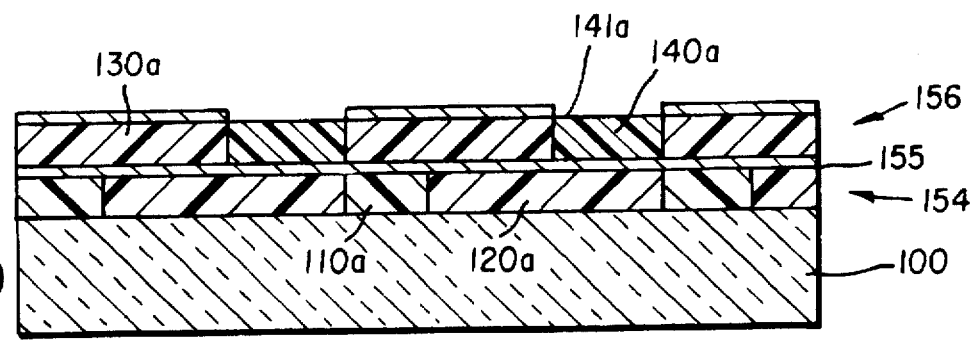
Figure 4E:
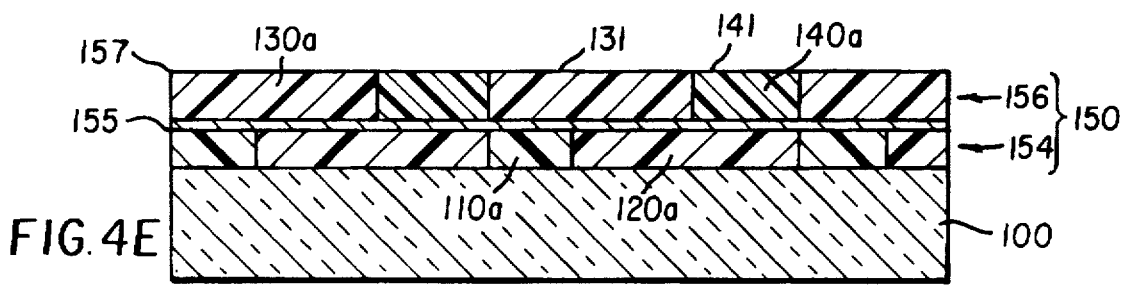

In another preferred embodiment of the present invention, illustrated in FIGS. 4A–4E, a method is provided by which a color filter array 150 is made in two planar parts, an upper planar color filter array 156 and a lower planar color filter array 154 (FIG. 4E). As shown in FIG. 4A, this method is initially similar to that discussed in association with FIGS. 3A to 3F, in which a support layer 100 is provided having planar surface 101 on which is provided first and second color filter elements 110a and 120a, identical to the structure of FIG. 3F. In FIG. 4A, protective film 114 is shown removed, preferable by dry etching in a fluorine containing atmosphere for the preferred case in which the first protective layer is nitride, or by further use of chemical mechanical polishing, thereby providing planar surfaces 111a, 121a. As in the previous embodiment, the color filter layers may be spin coated in the preferred ease that they are dyed polyimides, or may be deposited by other means, such as evaporation, in the case that they are evaporable pigments. By removal of protective film 114, a lower planar array surface 155 of lower color filter array 154 is formed, as depicted in FIG. 4A.

It is next desired to repeat the process described above (FIG. 4A) to establish an upper planar color filter array 156 with upper planar array surface 157 (FIG. 4E). In FIG. 4B, this process is initiated by uniformly providing a second protective film 124, preferably an evaporated nitride, overlying upper planar array surface 151 and by then providing sequentially third color filter layer 130 and third protective layer 134, of materials similar to those discussed in the previous embodiments. Third color filter layer 130 and third protective layer 134 are patterned in a manner similar to first color filter layer 110 and first protective layer 114, using conventional photoresist and sequential reactive ion etching, to provide third color filter elements 130a (FIG. 4C) with planar surfaces 131 (FIG. 4C). Then, in FIG. 4D, a fourth color filter layer 140, preferably also a polyimide, is shown coated, at least to a thickness equal to that of third color filter element 130a, and planarized by chemical mechanical polishing to remove fourth color filter layer 140 from over third color filter elements 130a to provide fourth color filter elements 140a with top surfaces 141a. Finally, by further planarization, preferably by dry etching or by chemical mechanical polishing using a silica based slurry, an upper planar array surface 157 is formed, free of third protective film 134, as depicted in FIG. 4E. Thereby is provided a method of making a color filter array 150 from upper and lower planar color filter arrays 154 and 156 respectively in registration with one another and with the photosensitive regions 14 (FIG. 3A) of imager semiconductor portion 40. As is well known in the art of subtractive color reproduction, a choice of spectral characteristics of the overlying color filter elements, for example cyan for one layer and magenta for the overlying layer, results in various desired primary color transmissions, in this example blue. Typically one of the four color filter elements in this embodiment is selected to be uncolored, serving only to provide a uniform optical index and mechanical planarity for color filter array 150.

Figure 2A:
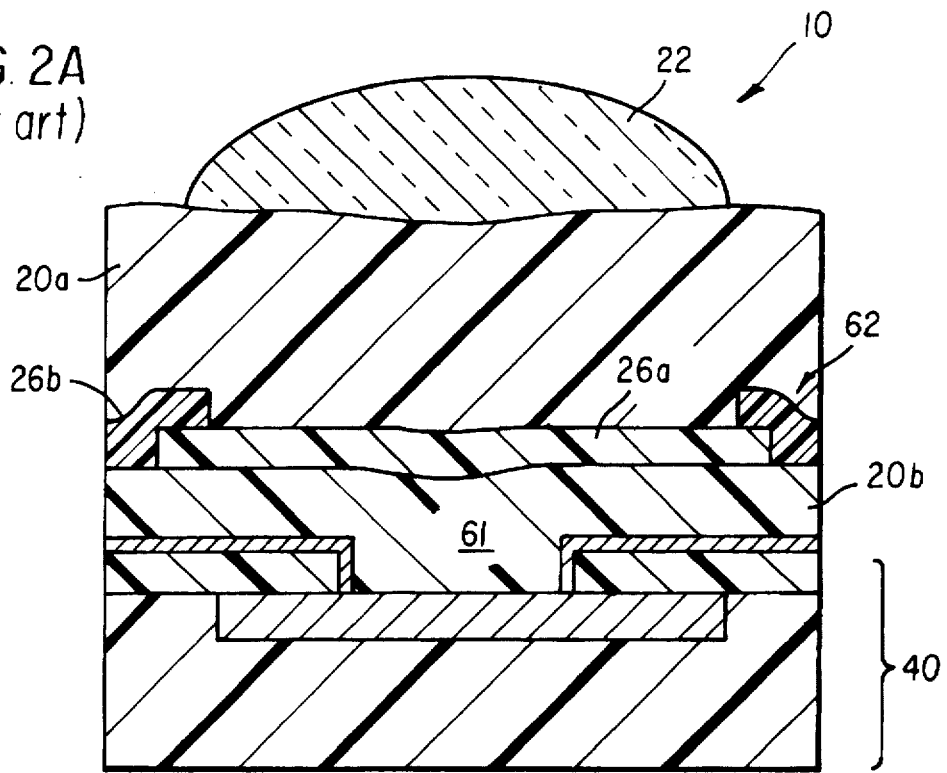
FIGS. 2A-2B show partial schematic cross-sectional views of various stages of making a prior art image sensor.
Figure 2B:
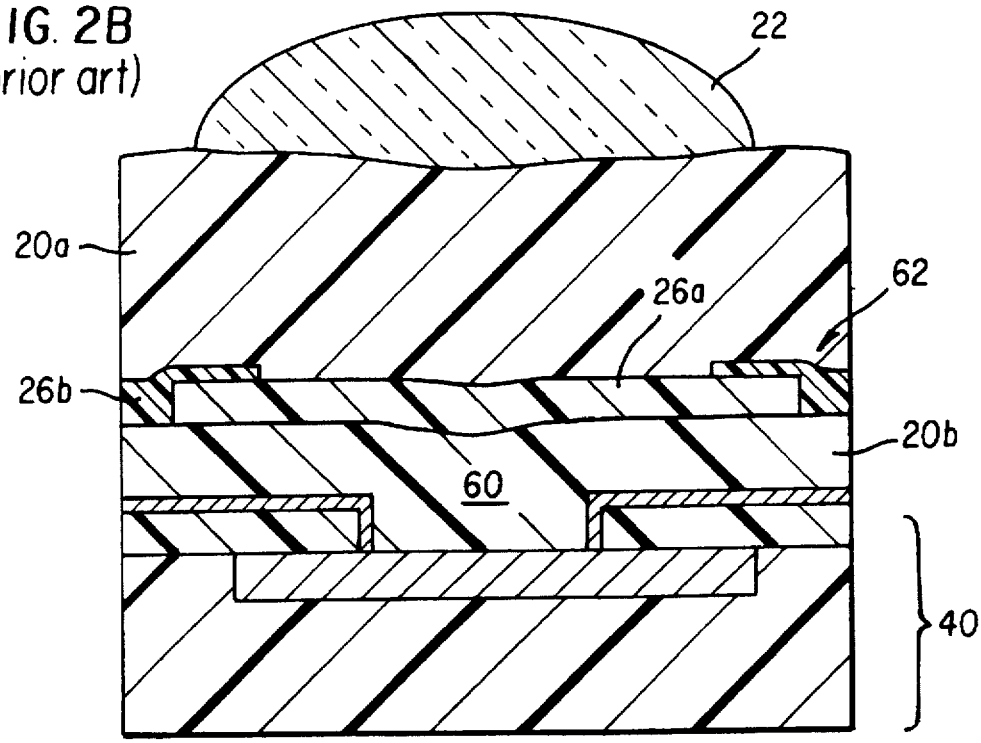
Figure 5A:
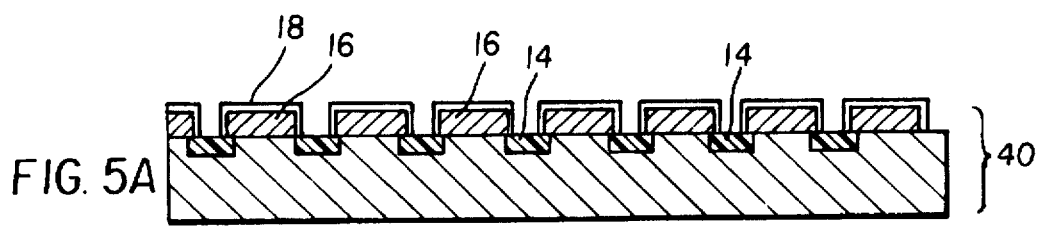
FIGS. 5A-5M show various cross-sectional views of different stages of making an imager pixel in accordance with this invention.
Figure 5B:
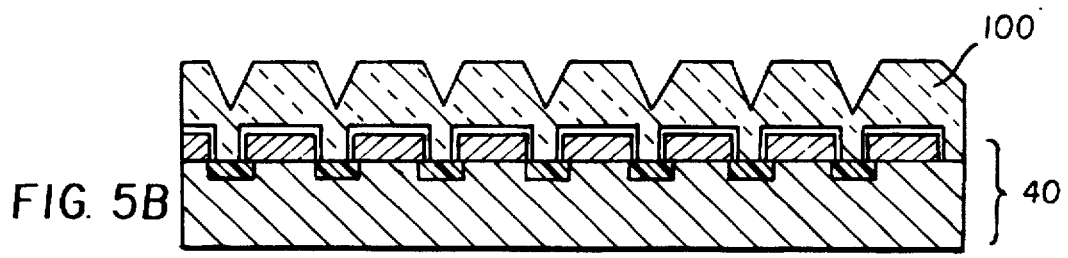
Figure 5C:
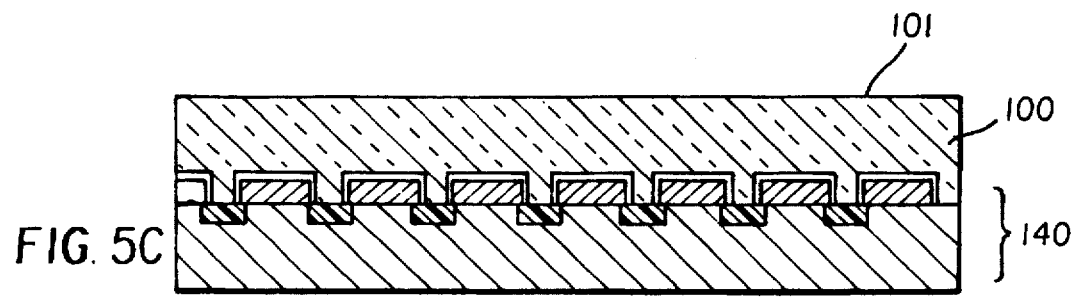
Figure 5D:
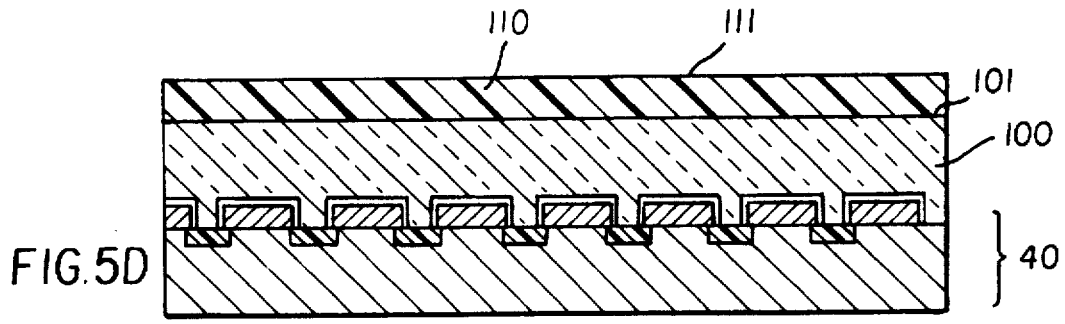
Figure 5E:
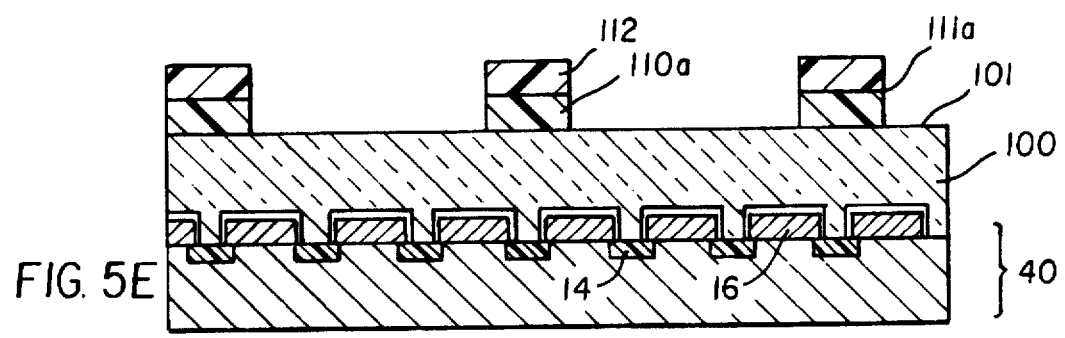

Another embodiment is now disclosed, in which the first, second, and third color filter elements of a single layer color filter array are provided separated from one another by a dye diffusion barrier. The method of fabrication is similar to that discussed in association with FIGS. 3A–3M, and where like parts correspond, the same numbers are used in these figures. Referring now to FIGS. 5A–5C, semiconductor portion 40, comprising photosensitive regions 14, electrodes 16, and lightshields 18 are shown as representative of the typical elements of semiconductor portion 40 of a solid state imager, on which it is desired to provide an integral, planar color filter array. In accordance with the present invention, this array is made by first providing a support layer 100 (FIG. 2B), preferably of oxide, deposited by chemical vapor deposition or a spin on glass, of thickness sufficient to cover the topography of semiconductor portion 40, typically in the range of one half to one microns. As shown in FIG. 5C, support layer 100 is planarized optically flat, preferably by chemical mechanical polishing, so that light rays directed toward planar surface 101 are refracted as expected from an ideal planar dielectric surface. On planar surface 101 is deposited a first color filter layer 110 (FIG. 5D), typically a dyed polyimide, with top surface 111, which transmits a selected portion of the visible spectrum of light incident on the imager. First color filter layer 110 may be spin coated in the preferred case that it is a dyed polyimide, or may be deposited by other means, such as evaporation, is the case that the color filter layer is an evaporable material such as a pigment. In FIG. 5E, first color filter layer 110 is shown patterned by conventional photolithography using photoresist 112 and etching, preferably by reactive ion etching in an oxygen plasma, to form first color filter element 110a with surfaces 111a, located in registration with the photosensitive region 14 of the imager.

Figure 5F:
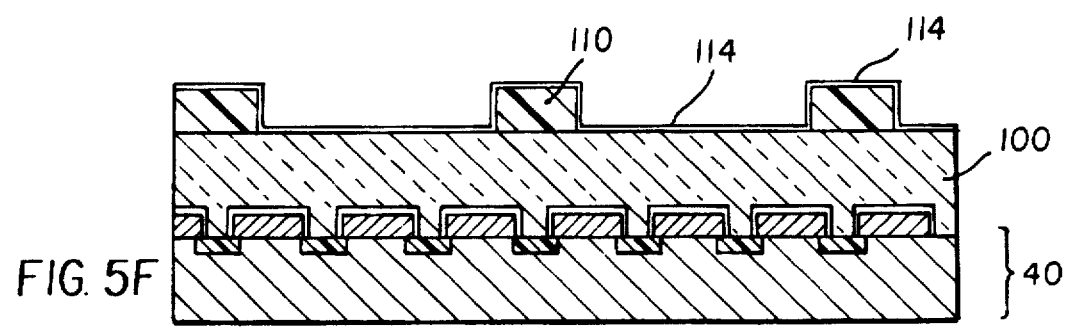
Figure 5G:
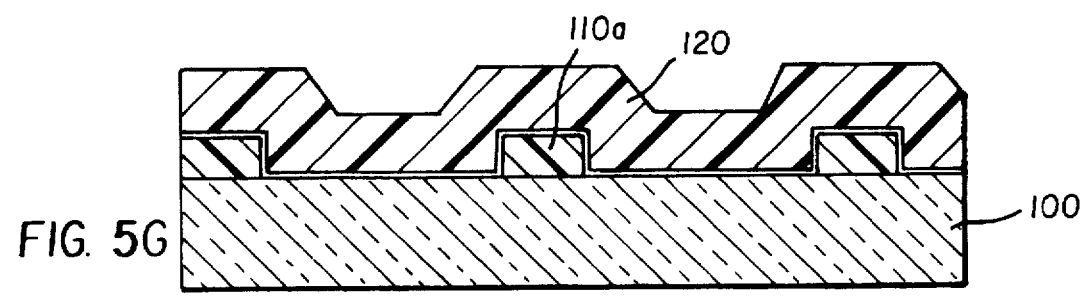
Figure 5H:
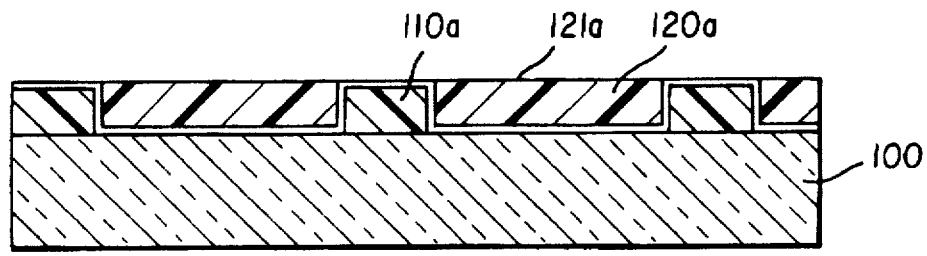

It now remains to form at least one additional color filter element transmitting a different portion of the visible spectrum from that of the first color filter element, with a top surface substantially coplanar with that of the first color filter element 110a. In accordance with this preferred embodiment of the current invention, this is accomplished after removal of photoresist 112 by providing a first protective film 114 (FIG. 5F), preferably a conformally sputtered dielectric film such as oxide or nitride, which covers the top and side surfaces of first color filter element 110a and exposed planar surface 101 which is both a dye diffusion barrier and which can serve additionally as a suitable etch stop for subsequent chemical mechanical polishing. Next, a second color filter layer 120, preferably also a dyed polyimide but transmitting a different portion of the visible spectrum from that of first color filter layer 110, is shown deposited with a thickness exceeding that of the first color filter layer 110, as depicted in FIG. 5G. Second color filter layer 120 may be spin coated in the preferred case that it is a dyed polyimide, or may be deposited by other means, such as evaporation, in the case that the color filter layer is an evaporable pigment. This layer is then removed, preferably by chemical mechanical polishing, using a slurry of aluminum oxide, entirely from over the first color filter elements 110a, thereby forming adjacent second color filter elements 120a (FIG. 5H). The surfaces 121a of second color filter elements 120a are shown substantially coplanar with the surfaces 111a of the first color filter elements 110a. This may be accomplished by extending the time of polishing beyond that required for the removal of the second color filter layer over the first color filter elements, while still retaining a planar surface 121, as is well known in the art of chemical mechanical polishing.

Figure 5I:
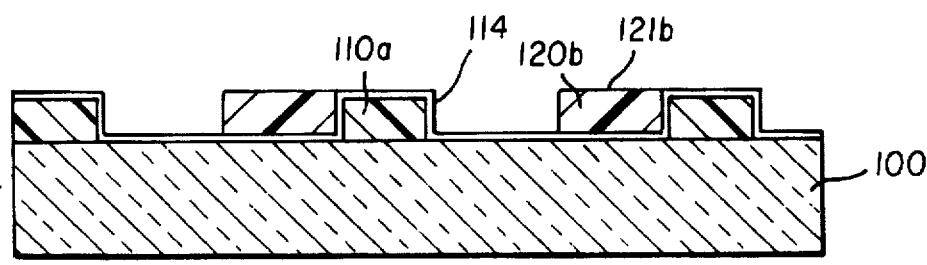
Figure 5J:
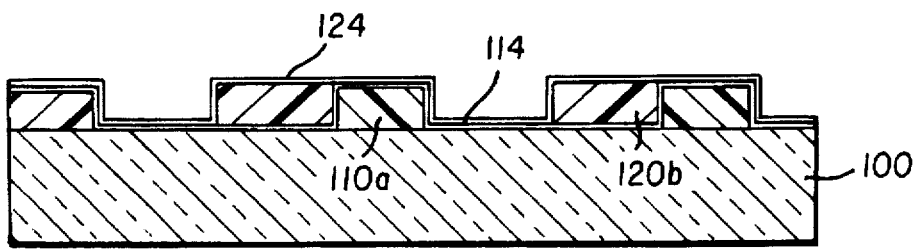
Figure 5K:
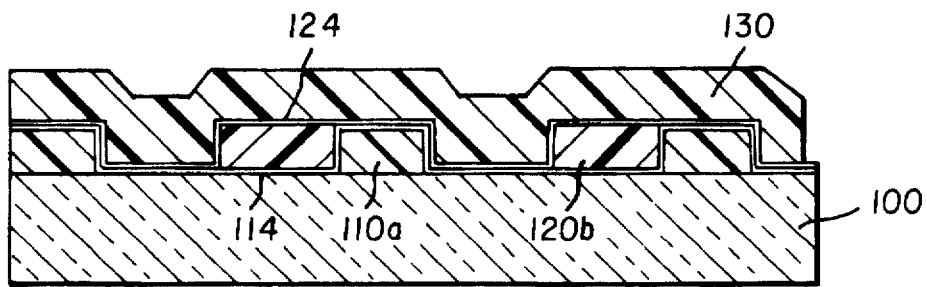
Figure 5L:
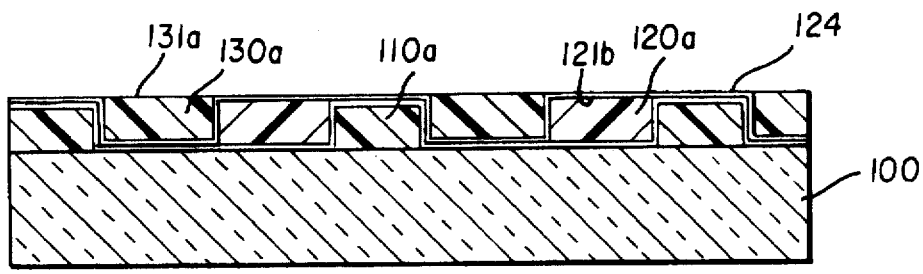
Figure 5M:
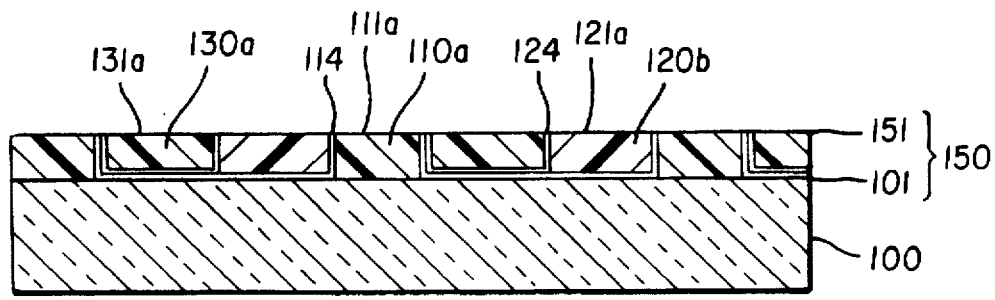

It is now desired to provide yet a third color filter element having a spectral transmission characteristic different from that of the other two color filter elements and located adjacent to the other color filter elements but separated form them by a dye diffusion barrier. This is preferable accomplished by etching away a portion of second color element 120a, for example by using a silylated photoresist patterned by conventional lithography and reactive ion etching in an oxygen plasma, thereby forming modified second color filter elements 120b with surfaces 121b (FIG. 5I). A second protective film 124, preferably also a conformally deposited nitride or oxide which is additionally a suitable etch stop for subsequent chemical mechanical polishing, is deposited on the exposed top and side surfaces of first and modified second color filter element 110a and 120b and exposed support layer surface 101, as shown in FIG. 5K. Then, in a manner similar to that used in providing the second color filter layer 120, a third color filter layer 130 is provided (FIG. 5K) to a depth at least the height of the first color filter element 110a, and is removed from over the first and modified second color filter elements 110a and 120b respectively, forming third color filter elements 130a with planar surfaces 131a. The surfaces 131a are shown in FIG. 5L as substantially coplanar with planar surfaces 121b, and 111a previously formed. By further planarization, preferably by chemical mechanical polishing using a silica based slurry, a planar color filter array 150, with a planar array surface 151 free of protective films 114 and 124, is formed, as depicted in FIG. 5M. Advantageous in this embodiment, in addition to the provision of a dye diffusion barrier, is the flexibility afforded in the choice of the optical and mechanical thickness of protective films 114 and 124. By choosing these thicknesses independently, it is clear from FIG. 5M that three independent thicknesses for color filter elements 110a, 120b, and 130a may be obtained, since color filter element 110a has no underlying protective film, color filter element 120b has one underlying protective film (114), and color filter element 130a has both underlying protective films (114 and 124).

Figure 6A:
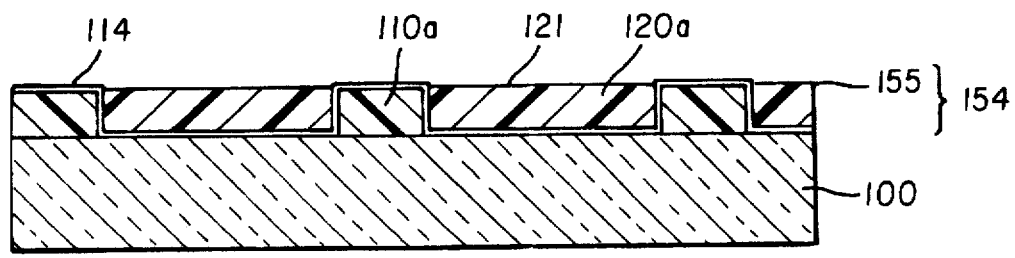
FIGS. 6A-6B show cross-sectional views of different stages of making an imager pixel made in accordance with this invention.
Figure 6B:
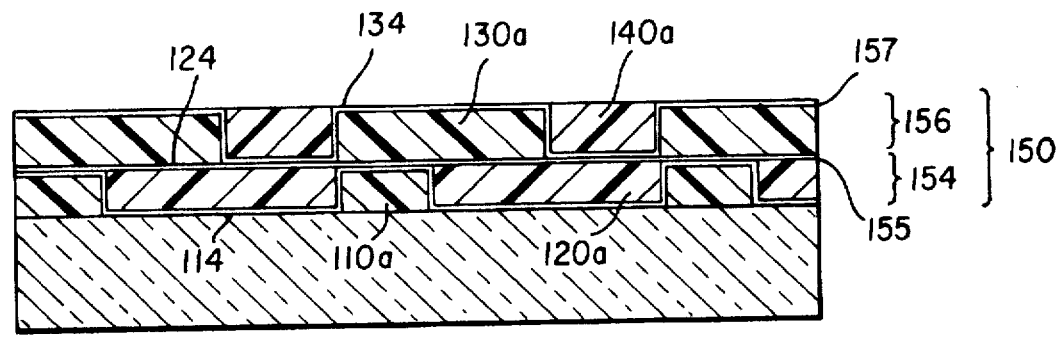

In another related embodiment, a planar color filter array is achieved comprised of an upper and lower planar color filter array as disclosed in the discussion of FIG. 4 but including the feature of a dye diffusion barrier separating each color filter element. Referring to FIG. 6A, similar to FIG. 5H, a lower color filter array 154 is shown comprised of color filter elements 110a and 120a separated by protective film 114. By repeating the sequence of steps precisely as discussed in FIG. 4B to FIG. 4E, an upper color filter army 156 is provided in registry with lower color filter array 154. Thereby is provided a method of making a color filter array 150 of the subtractive color reproduction type, as described in the discussion of FIG. 4, but having the advantageous feature, in addition to the provision of dye diffusion barriers between all color filter elements, of the flexibility afforded in the choice of the optical and mechanical thickness of protective films 114, 124, and 134. By choosing these thicknesses independently, it is clear from FIG. 6B that three independent thicknesses for color filter elements 110a, 120a, and 130a may be obtained, since color filter element 110a has no underlying protective film, color filter element 120a has one underlying protective film (114), and color filter element 130a has one protective films (124), and fourth color filter element 140a has two underlying protective films (124 and 134).

Referring now to FIG. 7, a preferred embodiment is described in which the consecutive replacement of color filter elements is used to effect a single layer color filter array with color filter elements separated from one another by dye diffusion barriers and having an arbitrary number of color filter elements all self-aligned, independent of mask to mask alignment tolerances. As shown in FIG. 7, upon a support layer 200 with planar surface 201 similar to support layer 100 of FIG. 3B is provided a first color filter layer 210, preferably of a dyed polyimide or other dyed polymer material capable of being etched. First color filter layer 210 is shown patterned by conventional lithography, for example by the use of silylated photoresist, in FIG. 7B to form first color filter elements 210a with planar surfaces 211a, in registry with alternate pixels of the underlying semiconductor portion (not shown). On first color filter elements 210a is deposited conformally, preferably by sputtering, first protective film 214 (FIG. 7C), preferably comprised of a transparent dielectric such as nitride or oxide. In FIGS. 7D–7E, a second color filter layer 220 is shown coated and patterned to form second color filter elements 220a (FIG. 7B) with planar surfaces 221a, in a manner similar to that discussed in the previous embodiments. In FIGS. 7D and 7E, the materials of first and second color filter elements 210a and 220a are indicated to be identical, for the purpose of illustrating the nature of the present embodiment. In general, however, the two color filter elements could be chosen to have different spectral characteristics.

Figure 7A:
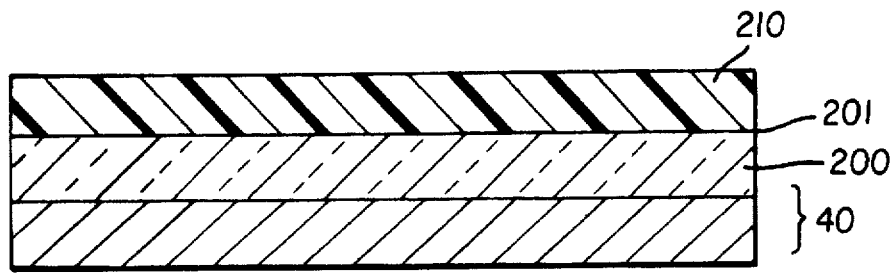
FIGS. 7A-7J show cross-sectional views of different stages of making an imager pixel made in accordance with this invention.
Figure 7B:
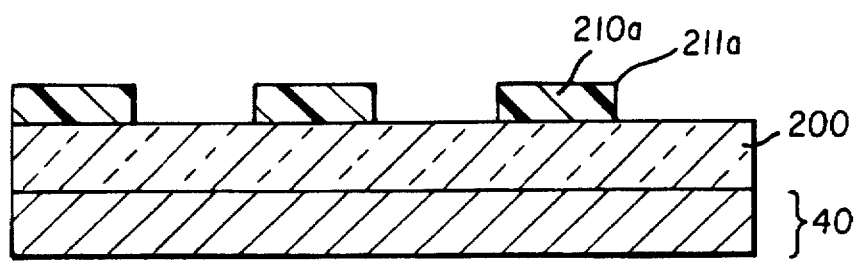
Figure 7C:
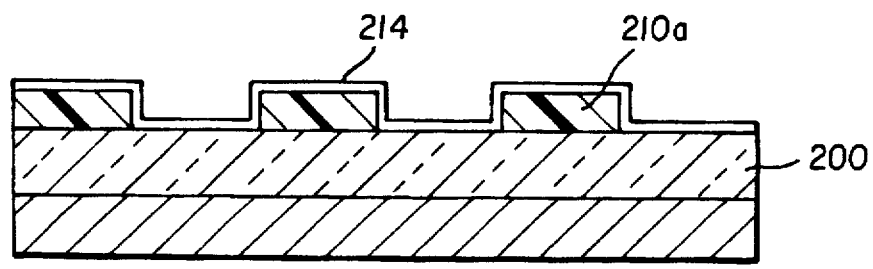
Figure 7D:
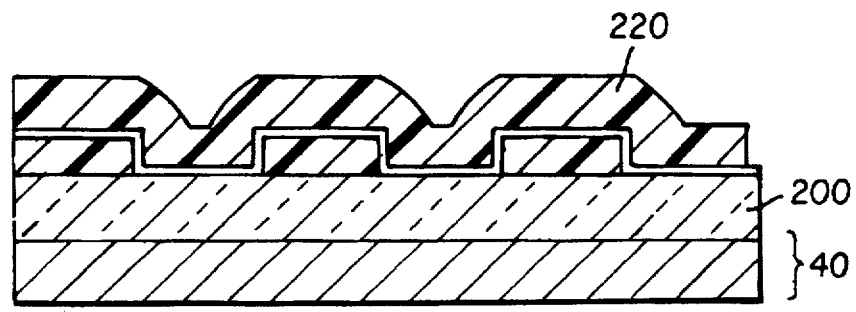
Figure 7E:
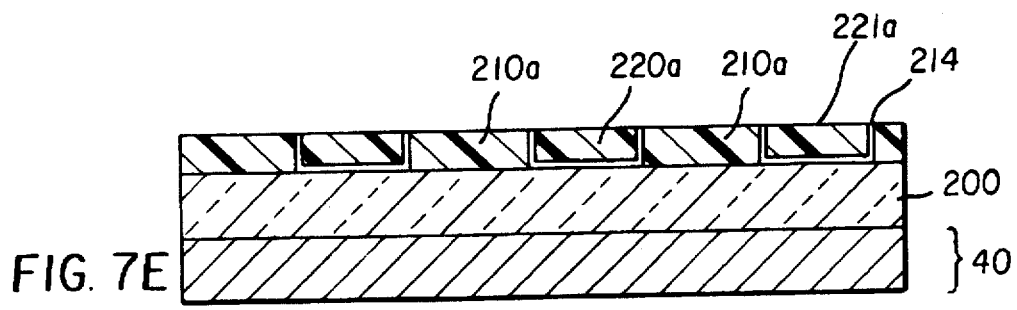
Figure 7F:
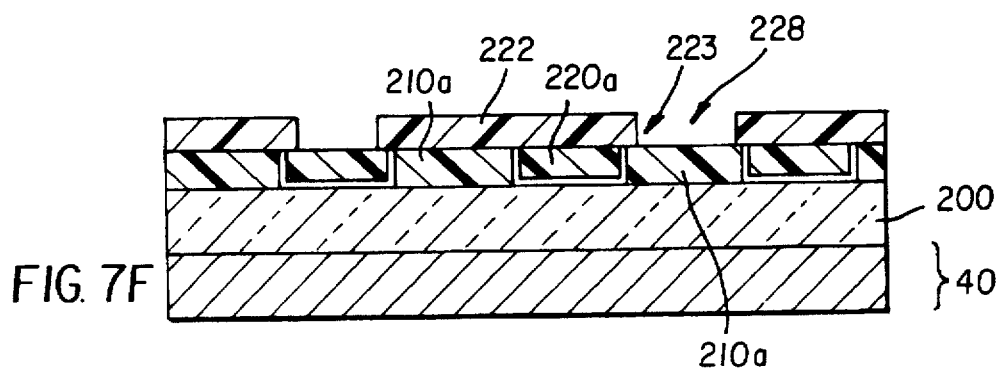
Figure 7G:
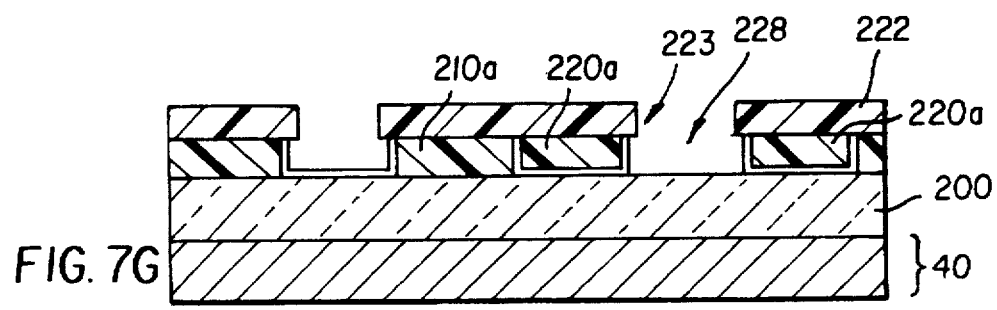

In FIG. 7F, photoresist 222 has been patterned with openings 228 defined within every third color filter element, regardless of the whether the color filter element is a first (210a) or second (220a) color filter element. In FIG. 7G, the color filter elements so selected by openings 228 in photoresist 222 have been removed, regardless of the whether the color filter element is a first or second color filter element. An overlap region 223 of photoresist 222 is shown in FIG. 7G and is permitted providing the etch used to remove the color filter elements in openings 228 is substantially selective against photoresist 222 as well as support layer 100.

Figure 7H:
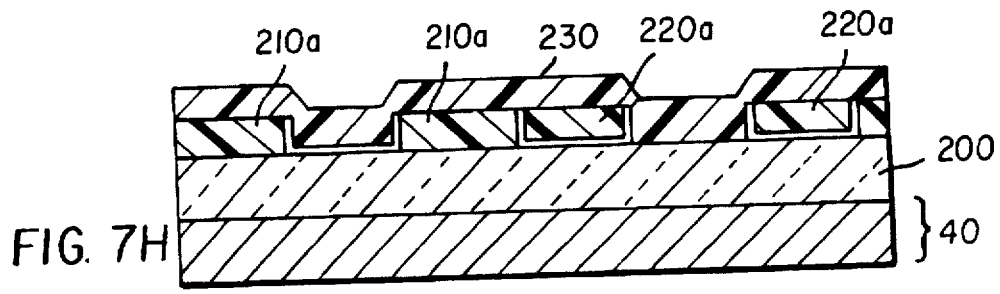
Figure 7I:
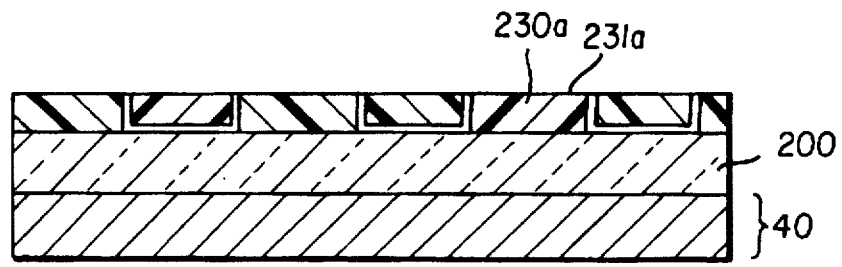
Figure 7J:
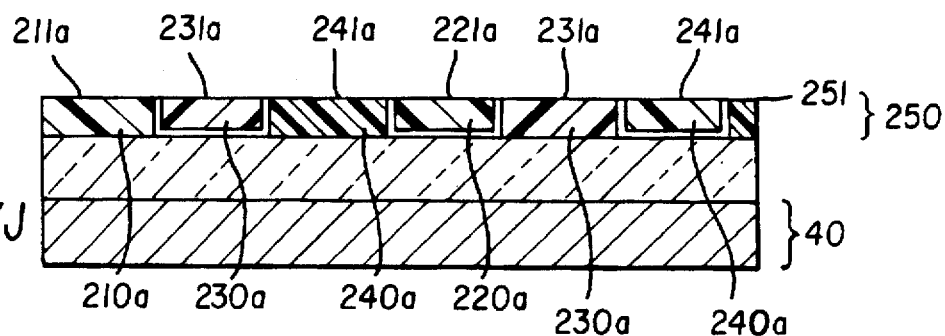

It is now desired to provide third color filter elements 230a in openings 228, as is shown in FIGS. 7H and 7I, by coating (FIG. 7H) third color filter layer 230 and removing it (FIG. 7I) by chemical mechanical polishing from over first and second color filter elements 210a and 220a, using the methods taught in previous embodiments. This process is shown repeated in FIG. 7J, in which every third color filter element, regardless of the whether the color filter element is a first (210a) or second (220a) color filter element, has again been removed and replaced by a fourth color filter element 240a defined by chemical mechanical polishing of fourth color filter element 240. Thereby is provided in FIG. 7J, first, second, third, and fourth color filter elements 210a, 220a, 230a and 240a with coplanar surfaces 211a, 221a, 231a, and 241a having no overlap vertically and separated by dye diffusion barrier 114. It is to be appreciated that the choice of which of the color filter elements of FIG. 7E to replace is totally arbitrary, thereby affording substantial flexibility in the positioning and number of color filter elements desired in the color filter array. Hence, this method advantageously provides for an arbitrary number of color filter elements all self-aligned, independent of mask to mask alignment tolerances. It is also to be appreciated that although this example is shown in FIGS. 7A–7I for the case in which first and second color filter layers 210 and 220 are identical for simplicity of illustrating a final repeat pattern of three distinct color filter elements, all other choices for the spectral characteristics of the color filter layers are in principal possible as well as the choices of which color filter elements are to be replaced, and such general choices may be desired for certain applications. Alteratively, the material chosen for the first two color filter layers may be a sacrificial material picked for other characteristics, such as its ability to be selectively etched, and therefore may be replaced by consequently repeating three times the sequence of steps leading to replacement of one color filter element with another described in FIGS. 7F–FIG. 7H in this embodiment.

Figure 8A:
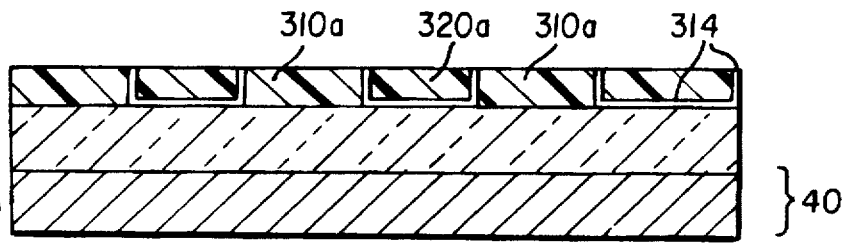
FIGS. 8A-8F show cross-sectional views of different stages of making an imager pixel made in accordance with this invention.
Figure 8B:
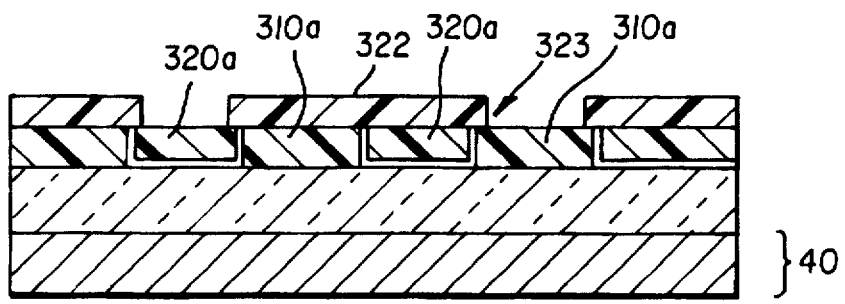
Figure 8C:
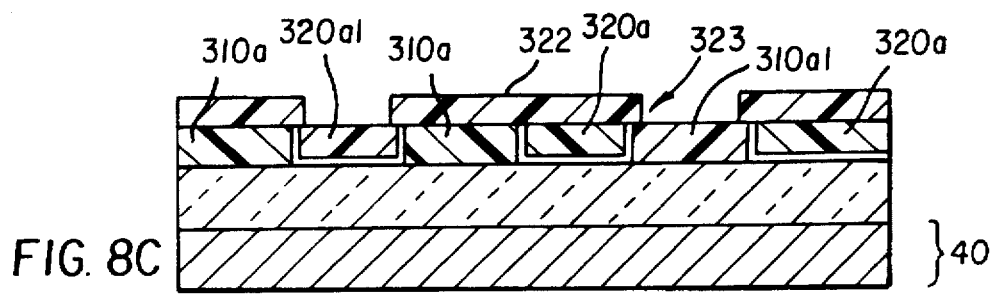
Figure 8D:
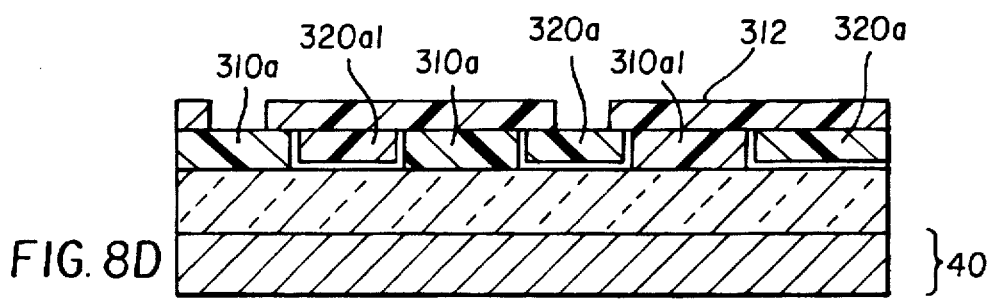
Figure 8E:
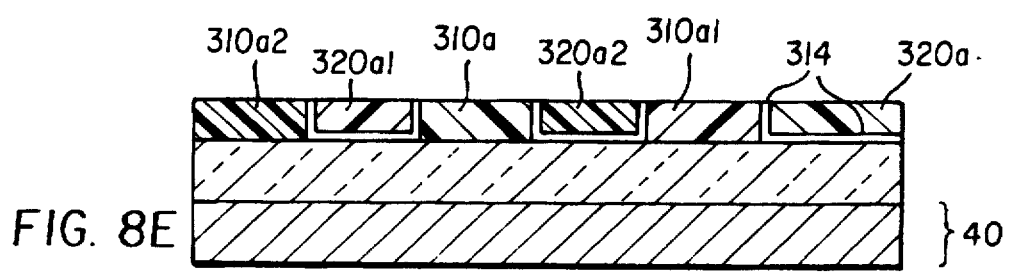
Figure 8F:
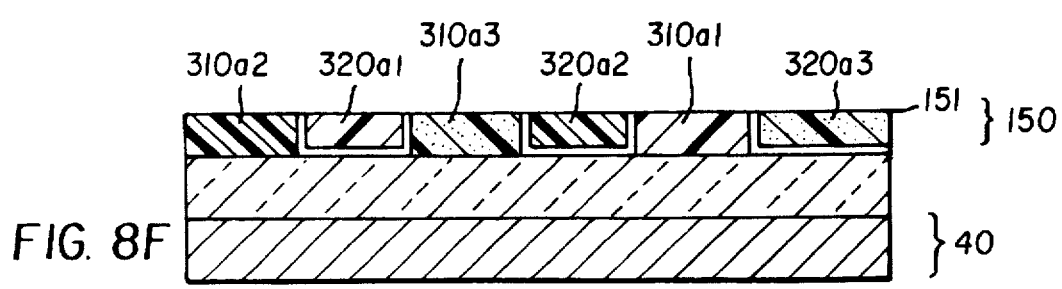

Turning now to FIG. 8A, yet another preferred embodiment is described, in which the consecutive dying of mordant materials is used to effect a single layer color filter array with color filter elements separated from one another by dye diffusion barriers and having an arbitrary number of color filter elements all self-aligned independent of mask to mask alignment tolerances. This embodiment also advantageously prevents lateral diffusion of the color filter elements during dyeing of the mordant, otherwise a disadvantage of mordant dyeing. As shown in FIG. 8A, a structure is formed on a semiconductor portion (not shown) identical to that shown in FIG. 7E, but in this embodiment first and second color filter elements 210a and 220a are replaced by first and second mordant elements 310a and 320a formed from first and second mordant layers 310 and 320, (not shown) by the same fabrication sequence described in association with FIGS. 7A–7E. The mordant layers 310 and 320 are preferably polymeric materials capable of being dyed subsequently to form color filter elements whose spectral characteristics are determined by the type of dye. In FIG. 8H, protective film 314, preferably nitride, is formed in a manner identical to protective film 214 by the same fabrication sequence described in association with FIGS. 7A–7E. In FIG. 8B, photoresist 322 has been defined to provide openings well within every third mordant element, regardless of the whether the mordant element was a first or second mordant element. The photoresist is preferably chosen not to imbibe dye when dyeing is performed. Subsequently, as in FIG. 8C, the structure of FIG. 8B is dyed with a first dye type, for example by being placed in a liquid dye bath, thereby forming color filter elements 310a1 and 320a1, formed respectively from dyeing first and second mordant elements 310a and 320a. The process depicted in FIGS. 8B and 8C (patterning a photoresist so as to have openings inside every third mordant element and dyeing the thereby selected first and second mordant elements 310a and 320a), is shown repeated in FIGS. 8D and 8E to form color filter elements 310a2 and 320a2, formed respectively from dyeing first and second mordant elements 310a and 320a with dye of a second type. Then the process is repeated a third time, as shown in FIG. 8F, to form color filter elements 310a3 and 320a3, formed respectively from dyeing first and second mordant elements 310a and 320a with dye of a third type.

Figure 9A:
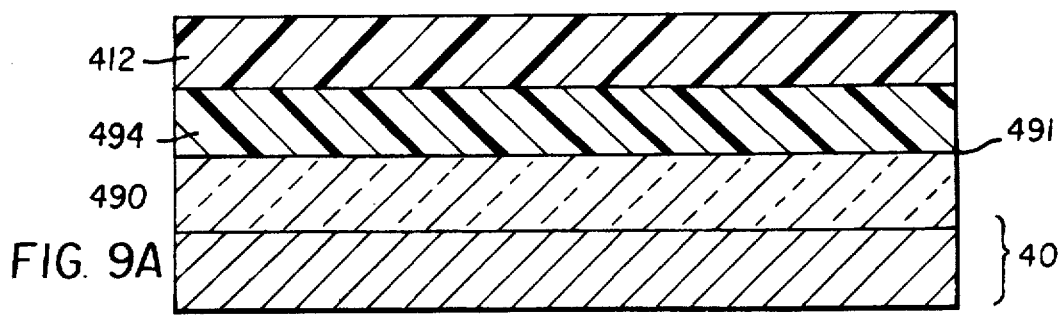
FIGS. 9A-9D show cross-sectional views of different stages of making an imager pixel made in accordance with this invention.
Figure 9B:
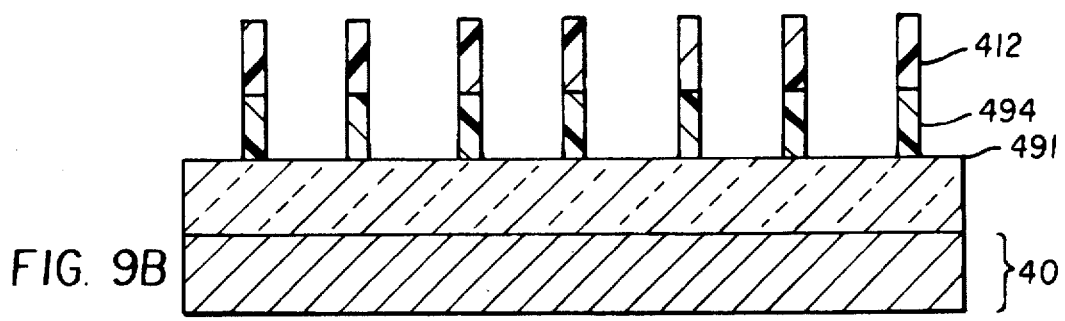
Figure 9C:
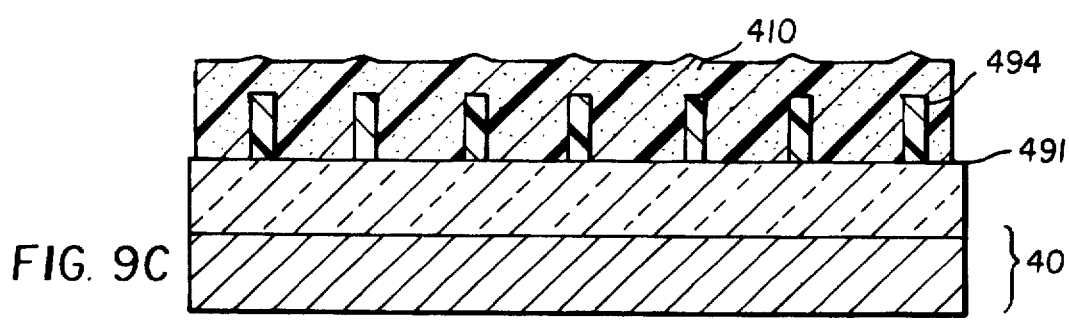
Figure 9D:
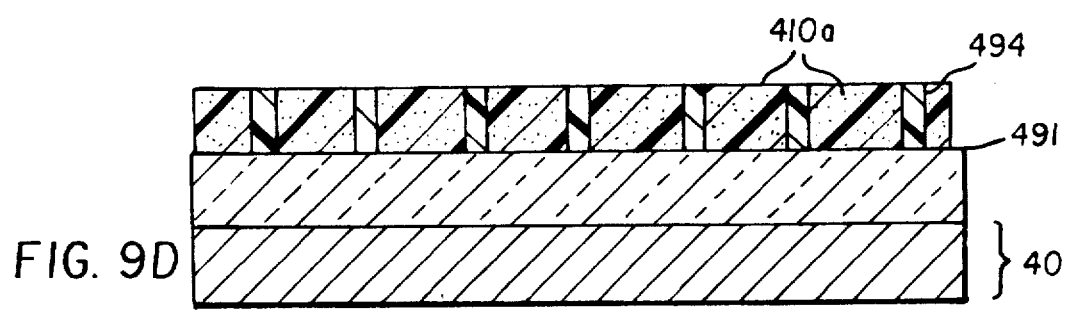

Turning now to FIG. 9, another preferred embodiment is shown in which the consecutive dying of mordant materials is used as in the previous embodiment to effect a single layer color filter array with color filter elements separated from on another by dye diffusion barriers but in which the structure shown in FIG. 8A is achieved as shown in FIG. 9A, by first coating upper support layer 494, preferably nitride, on lower support layer 490, preferably oxide, with optically planar front surface 491 made planar by chemical mechanical polishing, then depositing photoresist 412. As in the other embodiments, semiconductive portion 40 underlies upper and lower support layers 494 and 490. Next, photoresist 412 is patterned (FIG. 9B) in the form of narrow stripes, and portions of upper support layer 494 are etched, preferably by reactive ion etching using $C_2F_6$ gas, the etch stopping selectively on lower support layer 490. After removal of the photoresist, single mordant layer 410 is coated uniformly over the remaining portions of upper support layer 494, preferably to a thickness about equal to that of upper support layer 494 (FIG. 9C) and then mordant layer 410 is removed from over the remaining portions of upper support layer 494, preferably by chemical mechanical polishing (FIG. 9D) to form single mordant elements 410a. The resulting structure is then of the form of FIG. 8A as is required to complete the fabrication of the type of color filter array described in association with FIG. 8A, except that all mordant elements are identical in this embodiment. Preferably, the mordant layer 410 is fully removed from the remaining portions of upper support layer 494, but this is not always required in cases in which the mordant layer 410 is not too thick, for example less than 1000 Å thick, in regions over the remaining portions of upper support layer 410.

Figure 10A:
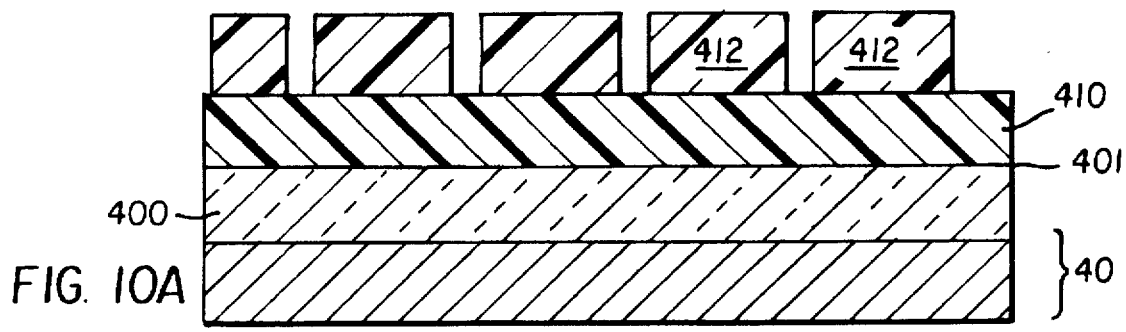
FIGS. 10A-10D show cross-sectional views of different stages of making an imager pixel made in accordance with this invention.
Figure 10B:
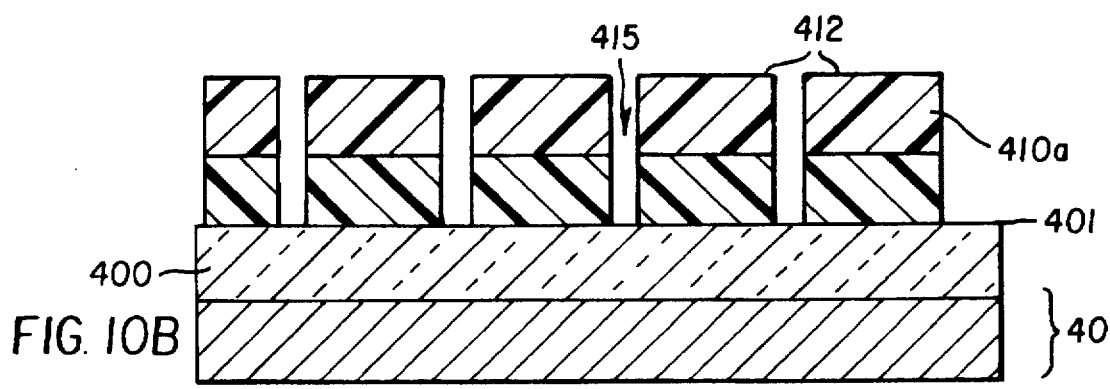
Figure 10C:
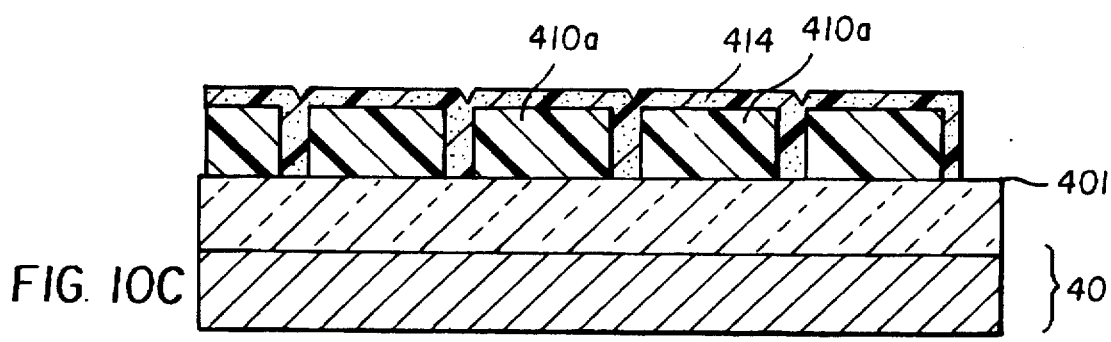
Figure 10D:
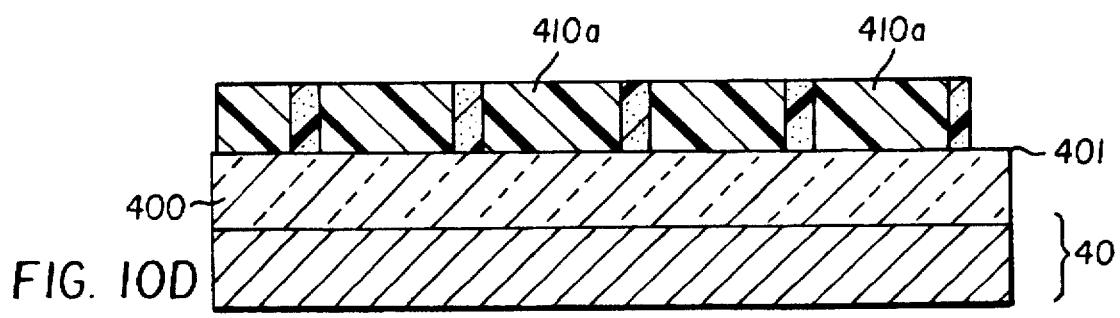

Similarly, in a related embodiment, a structure is provided for the consecutive dying of mordant materials separated from on another by dye diffusion barriers by the steps of first coating and patterning a single mordant layer 410, FIG. 10A, on a support layer 400 and then patterning photoresist 412 with narrow openings (FIG. 10B) which allow the etching of grooves 415 through selected regions of single mordant layer 410. After removal of photoresist 412, protective layer 414, preferably nitride, is deposited in groves 415 and on single mordant layer 410, as shown in FIG. 10C. Finally, (FIG. 10D) protective layer 414 is removed from over single mordant layer 410 but not from groves 415, preferably by chemical mechanical polishing. Again, the resulting structure is of the form of FIG. 8A as is required to complete the fabrication of the type of color filter array described in association with FIG. 8A. Protective layer 414 may also be metallic, for example comprising a metal from the group tungsten, tantalum, and titanium and the silicides of these metals, and aluminum, to act as a light shield as well as a dye diffusion barrier.

It is to be appreciated that the particular example shown to illustrate the embodiment is not restrictive in the choice of color filter patterns. Indeed, it is possible to provide an arbitrary number of and positioning of color filter elements by repeating the process of photoresist patterning to expose particular mordants and by subsequent mordant dyeing. Advantageous in the method disclosed, in that embodiment associated with FIGS. 8, 9, and 10, is the fact that the positioning of all color filter elements is determined by a single patterning step and that subsequent mask alignments tolerances are relaxed, due to the fact that dyes diffuse readily in mordants to a saturated dye density characteristic of the dye and mordant, as is well known in the art.

The invention has been described in detail with particular reference to certain preferred embodiments thereof, but it will be understood that variations and modifications can be effected within the spirit and scope of the invention.

PARTS LIST 10 pixel
12 semiconductor substrate
14 photosensitive regions
16 electrode
18 light shield
22 planar color filter array
24 color filter elements
26 lower planar color filter array
28 upper planar color filter array
30 planarizing layer
22 lens
40 semiconductor portion
60 region
62 region
100 support layer
101 planar surface
110 first color filter layer
110a first color filter element
111 planar surface
111a planar surface
112 photoresist
114 first protective film
118 opening
120 second color filter layer
120a second color filter element
120b modified second color filter element
121a planar surface
121b planar surface
122 photoresist
124 second protective film
128 opening
130 third color filter layer
130a third color filter element
131a planar surface
134 third protective film
150 color filter array
151 planar array surface
154 lower color filter array
155 lower planar array surface
156 upper color filter array
157 upper planar array surface
200 support layer
201 planar surface
210 first color filter layer
210a first color filter element
211a planar surface
212 photoresist
214 protective film
218 openings
220 second color filter layer 220a second color filter element
221 planar surface
223 overlap region
228 openings
230 third color filter layer
230a third color filter element
231a planar surface
240 fourth color filter layer
240a fourth color filter element
241a planar surface
310 first mordant layer
310a first mordant element
310a1 first color filter element
310a2 second color filter element
310a3 third color filter element
320 first mordant layer
320a first mordant element
320a1 first color filter element
320a2 second color filter element
320a3 third color filter element
312 photoresist
314 protective film
322 photoresist
323 overlap region
400 support layer
410 single mordant layer
410a singe mordant element
412 photoresist
414 protective layer
415 groove
490 lower support layer
491 optically planar surface
494 upper support layer

We claim:

1. An image sensor which includes an integral color filter array having different colored color filter elements, comprising:

(a) a semiconductor substrate having an overlying support layer with an optically planar surface formed by chemical mechanical polishing;

(b) a plurality of spaced image pixels formed in the substrate; and (c) an array of contiguous color filter elements of different colors overlying the planar surface formed by chemical mechanical polishing whose top surfaces are optically coplanar and which have no overlap of color filter material between adjacent color filter elements.

2. The invention of claim 1 further including an overlying second array of contiguous color filter elements whose top and bottom surfaces are coplanar with no overlap of color filter materials between adjacent color filter elements.

3. The invention of claim 2 in which at least one of the color filter elements does not substantially absorb light in the visible spectrum.

4. An image sensor which includes an integral color filter array having different colored color filter elements, comprising:

(a) a semiconductor substrate having an overlying support layer with an optically planar surface formed by chemical mechanical polishing;

(b) a plurality of spaced image pixels formed in the substrate; and (c) an array of contiguous color filter elements of different colors formed by chemical mechanical polishing overlying the planar surface whose top surfaces are optically coplanar and which have no overlap of color filter material between adjacent color filter elements and whose adjacent color filter elements are separated by an inorganic protective film which is a dye diffusion barrier.

5. The invention of claim 4 further including an overlying second array of contiguous color filter elements whose top and bottom surfaces are coplanar and have no overlap of color filter materials between adjacent color filter elements and whose adjacent color filter elements are separated by an inorganic protective film which is a dye diffusion barrier.

6. The invention of claim 5 in which at least one of the color filter elements does not substantially absorb light in the visible spectrum.

7. An image sensor which includes an integral color filter array having different colored color filter elements, comprising:

(a) a semiconductor substrate having a support layer with an optically planar surface formed by chemical mechanical polishing;

(b) a plurality of spaced image pixels formed in the substrate; and (c) an array of dyeable mordant elements overlying the optically planar surface, the adjacent elements having no vertical overlap and being separated at all adjacent vertical sidewalls by a protective film which is a dye diffusion barrier.

* * * * *